United States Patent [19]
Chen

[11] Patent Number: 6,136,691
[45] Date of Patent: Oct. 24, 2000

[54] IN SITU PLASMA CLEAN FOR TUNGSTEN ETCHING BACK

[75] Inventor: Chang-Hui Chen, Tao-Yuan Hsien, Taiwan

[73] Assignee: Taiwan Semiconductor Manufacturing Corporation, Hsinchu, Taiwan

[21] Appl. No.: 09/085,322

[22] Filed: May 26, 1998

[51] Int. Cl.[7] .............................................. H01L 21/4763
[52] U.S. Cl. ...................... 438/627; 438/629; 438/643; 438/648
[58] Field of Search ................................... 438/627, 629, 438/643, 648

[56] References Cited

U.S. PATENT DOCUMENTS 5,514,622  5/1996  Bornstein .
5,521,119  5/1996  Chen et al. .
5,780,356  7/1998  Kim .

*Primary Examiner*—Jey Tsai
*Assistant Examiner*—Josetta Jones
*Attorney, Agent, or Firm*—Blakely, Sokoloff, Taylor, & Zafman LLP

[57] ABSTRACT

An insulating layer is formed on a semiconductor wafer. A titanium layer (Ti) is formed on the insulating layer. A titanium nitride (TiN) layer is formed on the Ti layer to act as a barrier layer. A tungsten (W) layer is deposited by using chemical vapor deposition. The tungsten layer is etched back to form a tungsten plug. While the wafer is still in the etching chamber, an in situ plans sputtering is performed to remove any fluorine contamination.

5 Claims, 1 Drawing Sheet

IN SITU PLASMA CLEAN FOR TUNGSTEN ETCHING BACK

FIELD OF THE INVENTION

The present invention relates to a process for manufacturing integrated circuits, and more specifically, to a process for manufacturing a tungsten layer in a semiconductor device.

BACKGROUND OF THE INVENTION

An electrically connecting structure such as an interconnection for connecting elements between semiconductor devices is becoming more critical as the sizes of the devices are scaled down. Typically, the interconnection or other electrically conducting elements are widely used for providing specific conducting paths in an electrical circuit. In the process of forming the electrical conducting structure over an underlying layer, it is important that the surface of the underlying layer be free of any contamination, such as moisture, particles or oxides. Further, the surface of the underlying layer must be planar for subsequent layer deposition.

Tungsten (W) is one of the common materials used in the formation of an electrical conducting structure. Before forming a tungsten layer over an underlying layer having an etched hole, a glue layer composed of titanium (Ti) is sputtered on the surface of the underlying layer and on the walls of the hole. Through chemical vapor deposition (CVD) or PVD, a titanium nitride (TiN) layer is formed on the glue layer to act as a barrier layer. A rapid thermal annealing step is subsequently employed after the barrier layer is formed.

Next, a tungsten layer is deposited over the TiN layer by CVD or PVD. The tungsten is etched back to leave tungsten only within the hole to form a tungsten plug. The reaction material for forming the tungsten layer includes $WF_6$ and $SiH_4$. Fluorine will be generated during this reaction. The fluorine contamination will remain on the tungsten layer and the glue layer when the tungsten layer is etched back. When the wafer is taken out of the etching chamber, the fluorine reacts with air or moisture to form undesirable precipitate on the surface of the tungsten layer and the glue layer. The precipitate presents bridging concerns in subsequent metallization.

The conventional method of dealing with the precipitate involves using a wet chemical to strip the precipitate. Next, an argon (Ar) plasma is used to prevent future formation of precipitate. This method involves two steps that adds to the complexity and cost of manufacturing semiconductor devices.

What is required is a simpler, less costly method of preventing formation of undesired precipitate. Prevention of precipitate formation will eliminate the conventional steps required in removal of the undesired precipitate.

SUMMARY OF THE INVENTION

An insulating layer is formed over the wafer for the purposes of isolation. A hole is etched into the insulating layer. Then, a glue layer composed of Ti is sputtered along the surface of the insulating layer. A TiN layer is formed on the glue layer to act as a barrier layer. The TiN layer is formed by using chemical vapor deposition (CVD) or PVD. The TiN layer is used as a barrier layer to prevent the Ti layer from reacting with a subsequent layer.

A tungsten layer is deposited on the TiN layer and in the etched hole. The tungsten layer is etched back to leave tungsten only within the hole to form a tungsten plug. While the wafer is still in the etching chamber, in situ plasma sputtering is performed to eliminate any fluorine contamination resulting from the formation of the tungsten layer. Because the fluorine contamination is eliminated before the wafer is exposed to air or moisture, formation of undesired precipitate is avoided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed for elimination of fluorine contamination caused from deposition and etching of a tungsten layer for use as an electrical contig structure.

Figure 1:
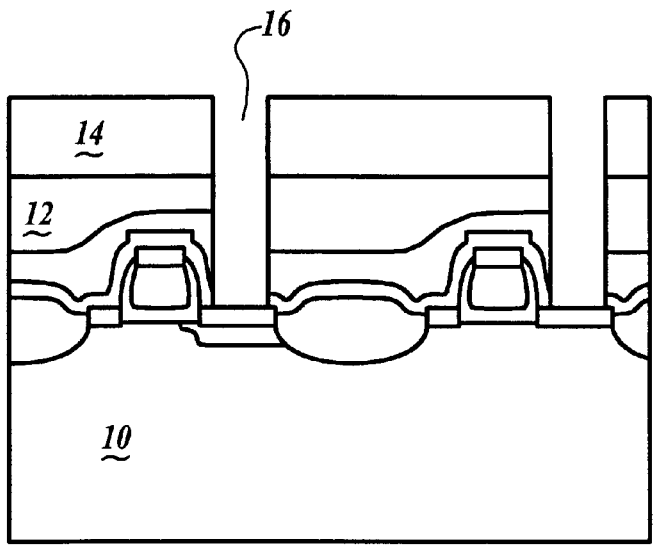
FIG. 1 is a cross-sectional view of a semiconductor wafer having exemplary semiconductor devices, illustrating the steps of forming an insulating layer on the wafer and etching a hole in the insulating layer according to the present invention.

Referring to FIG. 1, a silicon wafer or substrate 10 is provided with a <100> crystallographic orientation. Next, an insulating layer 12 is formed over the substrate 10 for the purposes of isolation. Typically, the insulating layer 12 is composed of silicon oxide, silicon nitride, BPSG or the like. For example, a silicon oxide layer 12 may be formed over the substrate 10 by using a chemical vapor deposition process. Alternatively, the silicon oxide layer 12 can be formed by thermal oxidation in oxygen ambient of the substrate in a conventional manner.

Next, using a photoresist 14, the insulating layer 12 is patterned and etched to form a contact hole 16 in the silicon oxide layer 12. After the etching is completed, the photoresist 14 is stripped.

Figure 2:
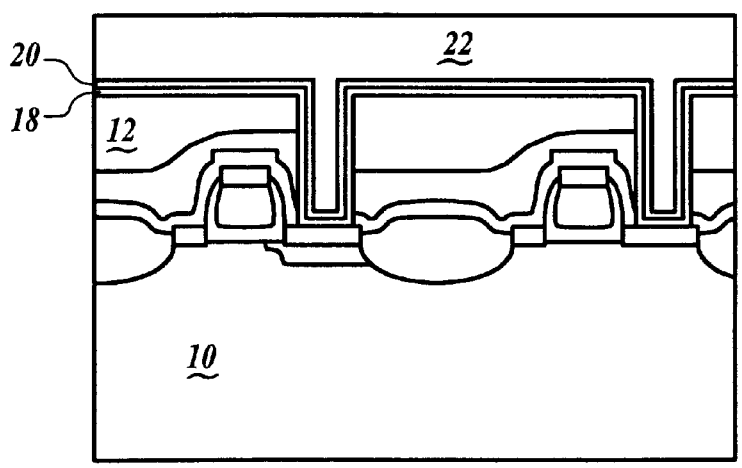
FIG. 2 is a cross-sectional view of a semiconductor wafer illustrating the step of forming a glue layer, a barrier layer, and a tungsten layer over the wafer in accordance with the present invention.

Turning to FIG. 2, a glue layer 18 composed of titanium (Ti) is formed along the surface of the silicon oxide layer 12 to have a thickness of between 100 to 800 angstroms by a sputtering technique. The temperature of the sputtering is about 250 to 450 degrees centigrade. Further, the flow rate of argon gas in the chamber is about 20 to 40 sccm.

A titanium nitride (TiN) layer 20 is formed on the Ti layer 18 to act as a barrier layer and prevent the Ti layer 18 from reacting with a subsequent layer. The TiN layer 20 is preferably formed by chemical vapor deposition (CVD) or PVD. The thickness of the TiN layer 20 is approximately 400 to 1000 angstroms. The temperature of the TiN layer 20 during formation is about 250 to 450 degrees centigrade. Furthermore, the flow rate of argon gas in the chamber is about 20 to 40 sccm, and the flow rate of nitrogen gas in the chamber is about 15 to 35 sccm. Next, a tungsten layer 22 is deposited over the TiN layer 20 and into the contact hole 16 by chemical vapor deposition.

Figure 3:
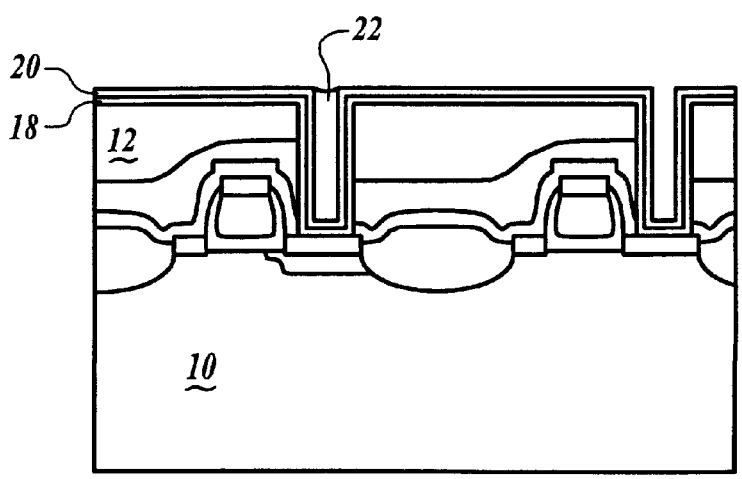
FIG. 3 is a cross-sectional view of a semiconductor wafer illustrating the step of etching back the tungsten layer in accordance with the pent invention.

Turning to FIG. 3, the tungsten is etched back to leave tungsten only within the hole 16 to form a tungsten plug. The reaction material for forming the tungsten layer includes $WF_6$ and $SiH_4$. Fluorine will be generated during the reaction. The fluorine contamination will remain on the tungsten layer 22 and the TiN layer 20 when the tungsten layer 22 is etched back. If the fluorine is exposed to air or moisture, it will read with the air or moisture and form undesirable precipitate on the tungsten and TiN. Therefore, while the wafer 10 is still in the etching chamber, in situ plasma sputtering is performed to clean the surface of the tungsten and the TiN. The power of the plasma is about 100 to 200 W. Further, the treatment time ranges from 20 to 40 seconds. Because the fluorine is removed before any exposure to air or moisture, formation of precipitate is avoided and the conventional steps required to remove precipitate are eliminated. Elimination of the precipitate removal steps increases the yield and thus, decreases the cost of manufacturing.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an electrically conducting structure over a semiconductor wafer, said method comprising:

forming an insulating layer over said semiconductor wafer for isolation;

forming a via in said insulating layer;

forming a titanium (Ti) layer over said insulating layer and in said via to act as a glue layer; forming a titanium nitride layer on said Ti layer to act as a barrier layer;

forming a tungsten layer over said TiN layer;

etching back said tungsten layer in an etching chamber; and performing an in situ plasma sputtering for removing any contamination while said wafer is still in said etching chamber.

2. The method of claim 1, wherein said tungsten layer is formed by chemical vapor deposition or physical vapor deposition.

3. The method of claim 1, wherein said tungsten layer is formed with reaction materials including $WF_6$ and $SiH_4$.

4. The method of claim 1, wherein the power of said plasma is about 100 to 200 W.

5. The method of claim 1, wherein the time of said in situ plasma sputtering is about 20 to 40 seconds.

* * * * *